United States Patent
Kwon et al.

(10) Patent No.: US 9,887,325 B2
(45) Date of Patent: Feb. 6, 2018

(54) LIGHT EMITTING DEVICE PACKAGE

(71) Applicant: LG INNOTEK CO., LTD., Seoul (KR)

(72) Inventors: Ji Na Kwon, Seoul (KR); Jeong Hyun Na, Seoul (KR); Ho Ki Kwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 217 days.

(21) Appl. No.: 14/289,191

(22) Filed: May 28, 2014

(65) Prior Publication Data

US 2014/0353703 A1    Dec. 4, 2014

(30) Foreign Application Priority Data

May 30, 2013 (KR) ........................ 10-2013-0061732

(51) Int. Cl.
| | |
|---|---|
| *H01L 33/50* | (2010.01) |
| *H01L 33/60* | (2010.01) |
| *H01L 33/56* | (2010.01) |
| *H01L 33/48* | (2010.01) |
| *H01L 33/58* | (2010.01) |

(52) U.S. Cl.
CPC ............ *H01L 33/501* (2013.01); *H01L 33/48* (2013.01); *H01L 33/56* (2013.01); *H01L 33/60* (2013.01); *H01L 33/58* (2013.01); *H01L 2224/48091* (2013.01); *H01L 2224/48247* (2013.01); *H01L 2924/12032* (2013.01)

(58) Field of Classification Search
CPC ......... H01L 33/48; H01L 33/56; H01L 33/60; H01L 33/58; H01L 2224/48091; H01L 2224/48247; H01L 2924/12032; H01L 33/501
See application file for complete search history.

(56) References Cited

U.S. PATENT DOCUMENTS

| | | | | |
|---|---|---|---|---|
| 6,340,824 | B1 * | 1/2002 | Komoto | ................ H01L 33/508 257/100 |
| 2006/0220053 | A1 * | 10/2006 | Furukawa | ........... H01L 25/0753 257/99 |
| 2007/0228391 | A1 | 10/2007 | Minami et al. | |
| 2008/0211429 | A1 * | 9/2008 | Saito | ........................ F21K 9/52 315/312 |
| 2009/0168404 | A1 * | 7/2009 | Matsukawa | ........ G02F 1/133604 362/97.2 |
| 2011/0254047 | A1 * | 10/2011 | Yoshitake | ................ C08L 83/04 257/100 |

(Continued)

FOREIGN PATENT DOCUMENTS

| | | |
|---|---|---|
| CN | 101047220 A | 10/2007 |
| CN | 101677119 A | 3/2010 |

(Continued)

*Primary Examiner* — Su C Kim
*Assistant Examiner* — David S Wilbert
(74) *Attorney, Agent, or Firm* — Birch, Stewart, Kolasch & Birch, LLP

(57) ABSTRACT

Disclosed is a light emitting device package including a body including a recess, first and second electrodes disposed on the body, a light emitting device provided on the first electrode, and a molding part disposed on the light emitting device. At least one of the body and the molding part includes benzotriazol (BTA).

20 Claims, 17 Drawing Sheets

(56) References Cited

U.S. PATENT DOCUMENTS

2014/0077245 A1 3/2014 Won et al.
2014/0203323 A1* 7/2014 Ozai .................... C09D 183/16
   257/100

FOREIGN PATENT DOCUMENTS

| CN | 101755346 A | 6/2010 |
| CN | 103044892 A1 | 4/2013 |
| EP | 2 078 736 A1 | 7/2009 |
| JP | 2006-237199 A | 9/2006 |
| JP | 2008-179694 A | 8/2008 |
| JP | 2012-144652 A | 8/2012 |
| JP | 2012-180432 A | 9/2012 |

* cited by examiner

FIG. 12
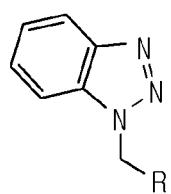
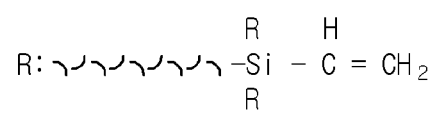

LIGHT EMITTING DEVICE PACKAGE

CROSS-REFERENCE TO RELATED APPLICATION

This application claims under 35 U.S.C. § 119 to Korean Patent Application No. 10-2013-0061732 (filed May 30, 2013), which is hereby incorporated by reference in its entirety.

BACKGROUND

The embodiment relates to a light emitting device package and a lighting device.

A light emitting device is a device to convert electrical energy into light energy. The light emitting device includes a light emitting diode (LED) and a laser diode (LD). For example, the light emitting device may represent various colors by adjusting the compositional ratio of compound semiconductors.

The light emitting device may constitute a light emitting source realized by using GaAs, AlGaAs, GaN, InGaN, and InGaAlP-based compound semiconductor materials.

The light emitting device is packaged so that the light emitting device may be realized in the form of a light emitting device package to represent various colors, and the light emitting device package has been applied to various fields such as a lighting indicator, a character indicator, an image indicator, and a lighting device to represent colors.

BRIEF SUMMARY

The embodiment provides a light emitting device package capable of preventing luminous intensity from being degraded as time passes to ensure the reliability.

According to the embodiment, there is provided a light emitting device package including a body including a recess, a first electrode and a second electrode disposed on the body, a light emitting device diposed on the first electrode, and a molding part disposed on the light emitting device. At least one of the body and the molding part includes benzotriazol (BTA).

According to the embodiment, there is provided a light emitting device package including a body including a recess, a first electrode and a second electrode provided in the recess, a light emitting device disposed on the first electrode, a molding part provided in the recess and covering the light emitting device, and a benzotriazol (BTA) layer formed on at least one of the first electrode and the second electrode.

As described above, according to the embodiment, the light emitting device package according to the embodiment can prevent luminous intensity from being degraded as time passes to ensure the reliability.

BRIEF DESCRIPTION OF THE DRAWINGS

FIGS. 11 and 12 are views to explain another example of the preparation of the benzotriazol reactant in the light emitting device package according to the embodiment.

DETAILED DESCRIPTION OF THE EMBODIMENTS

In the description of embodiments, it will be understood that when layers (or films), regions, patterns, or structures are referred to as being 'on'/'under' other layers (films), regions, pads, or patterns, respectively, they can be directly 'on'/'under' other layers (films), regions, pads, or patterns, respectively, or intervening layers (films), regions, pads, or patterns may also be present. In addition, Such a position of each layer has been described with reference to the drawings.

Hereinafter, a light emitting device package, a light emitting device unit, and a display device according to the embodiment will be described with reference to accompanying drawings.

Figure 1:
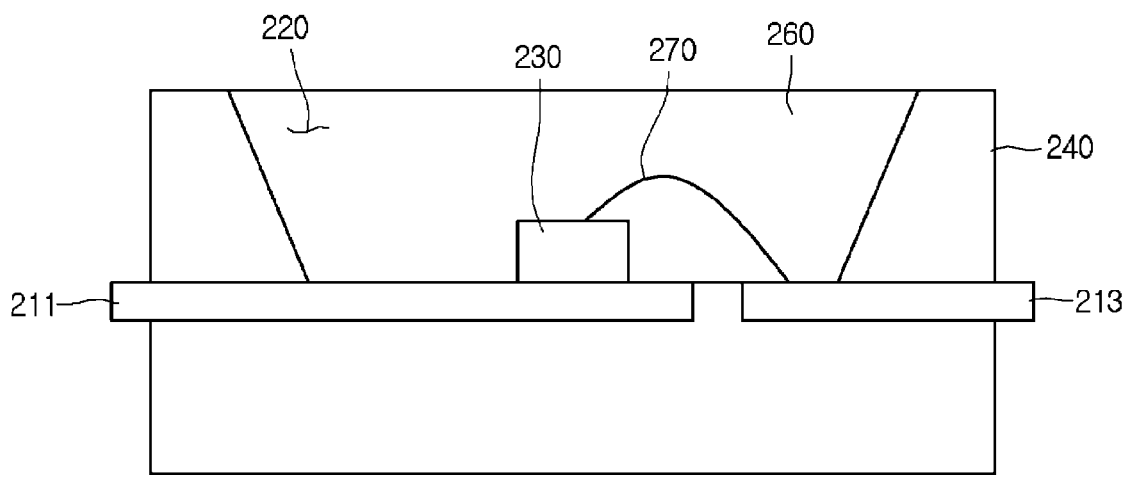
FIG. 1 is a sectional view showing a light emitting device package according to the embodiment.

FIG. 1 is a sectional view showing a light emitting device package according to the embodiment.

The light emitting device package according to the embodiment may include a first electrode 211, a second electrode 213, a light emitting device 230, a body 240, and a molding part 260 as shown in FIG. 1.

The light emitting device package according to the embodiment may include the first and second electrodes 211 and 213. For example, the light emitting device 230 may be provided on the first electrode 211. The light emitting device 230 may be electrically connected to the second electrode 213 through a wire 270. For example, the light emitting device 230 may be realized as a vertical type light emitting device or a lateral type light emitting device. The light emitting device 230 may be electrically connected to the first and second electrodes 211 and 213. The light emitting device 230 may be electrically connected to the first electrode 211 or the second electrode 213 through a wire bonding scheme, a flip-chip bonding scheme, or a die bonding scheme.

The first electrode 211 or the second electrode 213 may include a metallic material. For example, the first electrode 211 or the second electrode 213 may include at least one selected from the group consisting of titanium (Ti), copper (Cu), nickel (Ni), gold (Au), chromium (Cr), zinc (Zn), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first electrode 211 or the second electrode 213 may have a single layer structure or a multi-layer structure, but the embodiment is not limited thereto.

The body 240 may be provided on the first and second electrodes 211 and 213. The body 240 may be provided with a lateral side having an inclination surface at a peripheral portion of the light emitting device 230. The body 240 may include a recess 220 defined by the lateral side. The light emitting device 230 may be provided in the recess 220 and provided on the first electrode 211.

The body 240 may be realized by using any one among a silicon material, a ceramic material, and a resin material. For example, the body 240 may be realized by using at least one material among silicon, silicon carbide (SiC), aluminum nitride (AlN), a polyphthalamide (PPA) resin, a polycyclohexane dimethylene terephthalate (PCT) resin, and liquid crystal polymer (LCP), but the embodiment is not limited thereto.

In addition, the body 240 may be formed as a structure of a single layer substrate or a multi-layer substrate, or may be injection-molded, but the embodiment is not limited to the shape or the structure of the body 240.

A molding part 260 may be provided in the recess 220 of the body 240. The molding part 260 may be provided in the recess 220 to cover a lateral side and a top surface of the light emitting device 230. The wire 270 may be electrically connected to the light emitting device 230 and the second electrode 213. The wire 270 may be protected by the molding part 260. A top surface of the molding part 260 may be formed in a flat shape. In addition, the top surface of the molding part 260 may be formed in a convex shape or a concave shape.

The molding part 260 may be provided on the light emitting device 230 to protect the light emitting device 230. The molding part 260 may include a phosphor. The phosphor may receive light having a first wavelength band incident thereto from the light emitting device 230 and may provide converted light having a second wavelength band. For example, the molding part 260 may be realized by using a transparent resin material such as silicone or epoxy. In addition, the molding part 260 may have a flat surface. At least one type of phosphor may be contained in the molding part 260. For example, the phosphor may include a YAG, TAG, silicate, nitride or oxynitride-based phosphor.

In addition, the molding part 260 may further include a dispersing agent or a diffusing agent. For example, the diffusing agent may include at least one among materials including barium titanate, titanium oxide, aluminum oxide, and silicon oxide. The diffusing agent may be distributed in the molding part 260 to diffuse light emitted from the light emitting device 230. The dispersing agent may perform a function of uniformly dispersing phosphors in the molding part 260.

Meanwhile, various materials may be applied when the body 240 and the molding part 260 are realized. As the light emitting device 230 is driven for a long time, metallic parts of the first electrode 211, the second electrode 213, and silver (Ag) paste applied to a light emitting device package may be discolored. If the metallic parts are discolored, the luminous intensity of the light emitting device package may be degraded.

It is analyzed that the metallic parts are discolored because an acid material included in the body 240 or an acid material penetrated into the body 240 through the molding part 260 exerts an influence on the metallic parts. Accordingly, the present embodiment suggests a scheme of preventing the acid material contained in the body 240 or the molding part 260 from exerting an influence on the metallic parts to discolor the metallic parts.

Figure 2:
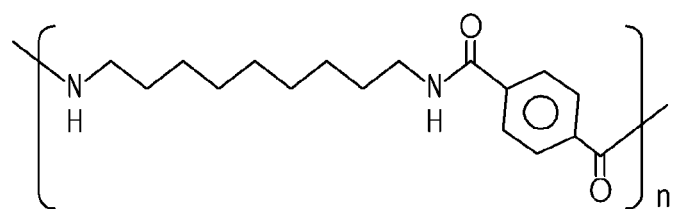
FIG. 2 is a view to explain a PPA resin applied to the light emitting device package according to the embodiment.
Figure 3:
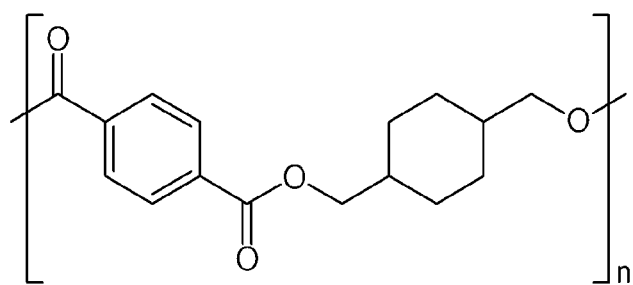
FIG. 3 is a view to explain a PCT resin applied to the light emitting device package according to the embodiment.
Figure 4:
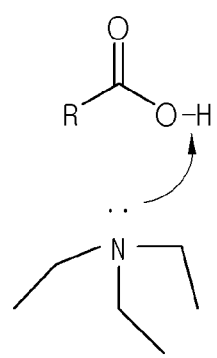
FIGS. 4 to 8 are views to explain the preparation of the benzotriazol reactant in the light emitting device package according to the embodiment.
Figure 5:
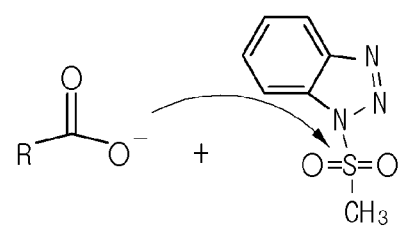
Figure 6:
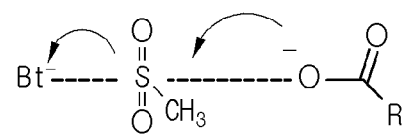
Figure 7:
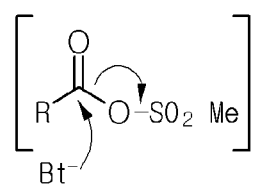
Figure 8:
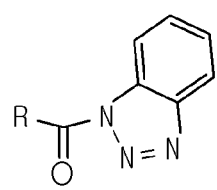

For example, when the body 240 may be formed by using a PPA resin or a PCT resin, threphthalic acid may remain in the body 240 after polymerization. FIG. 2 is a view to explain the PPA resin applied to the light emitting device package according to the embodiment. FIG. 3 is a view to explain the PCT resin applied to the light emitting device package according to the embodiment.

As shown in FIG. 2, the PPA resin has the bond between nonanediamine and terephthalic acid, and the PCT resin has the bond between terephthalic acid and cyclohexylenedimethanol.

In this case, the metallic parts may be discolored due to the side effect (metal corrosion by —COOH) of terephthalic acid remaining after the polymerization of the PPA resin or the PCT resin. It is analyzed that oxidation from —COOH ions to OH-ions occurs on a surface of the metallic part under a high temperature environment, so that the surface of the metallic part has an oxide layer thereon without being corroded. Accordingly, the metallic parts are discolored. In addition, according to the analysis, activated metal and hydroxide are formed due to the dissociation of —COOH ions to OH-ions under a high humidity environment. Accordingly, the metallic parts are discolored and the luminous intensify is degraded.

The embodiment suggests a scheme of capturing acid contained in the body 240 or the molding part 260. For example, benzotriazole (BTA) may be applied in order to capture the acid contained in the body 240 or the molding part 260.

When the benzotriazole is applied after forming the body 240, the benzotriazole may react to the terephthalic acid remaining after PPA resin or PCT resin polymerization as shown in FIGS. 4 to 8. FIGS. 4 to 8 are views to explain the preparation of the benzotriazol reactant in the light emitting device package according to the embodiment. In FIGS. 4 to 8, R—COOH represents the terephthalic acid and Bt represents the benzotriazole.

Figure 9:
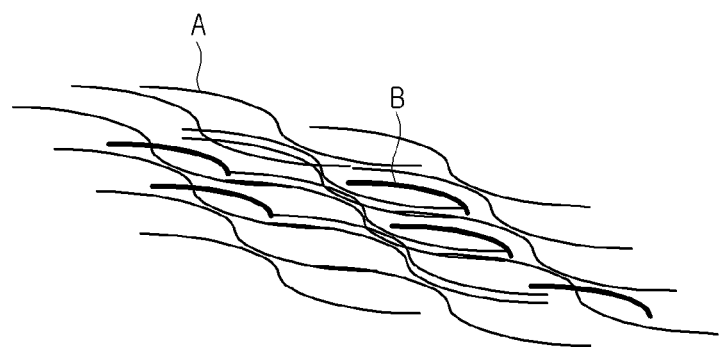
FIGS. 9 and 10 are views to schematically explain the preparation of the benzotriazol reactant in the light emitting device package according to the embodiment.
Figure 10:
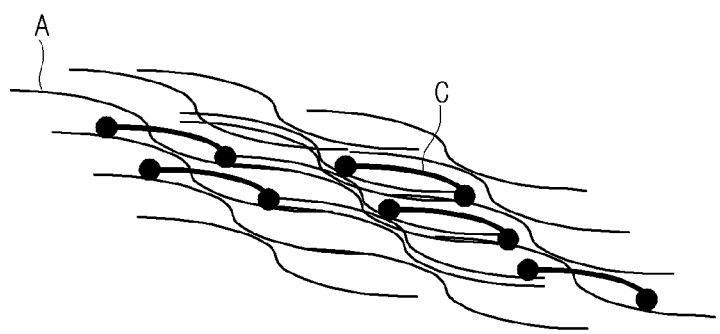

FIGS. 9 and 10 are views to schematically explain the preparation of the benzotriazol reactant in the light emitting device package according to the embodiment.

In other words, as shown in FIG. 9, unreacted monomers may exist in the polymerization resultant of the PPA resin or the PCT resin. In FIG. 9, reference sign A represents a polymer reactant of the PPA resin or the PCT resin, and reference sign B represents an unreacted monomer. In this case, if benzotriazole is added to the polymerization resultant, the benzotriazole reacts to the unreacted monomer as shown in FIG. 10 so that a benzotriazole reactant C is prepared. For example, unreacted terephthalic acid reacts to the benzotriazole so that the unreacted terephthalic acid may be removed.

Figure 11:
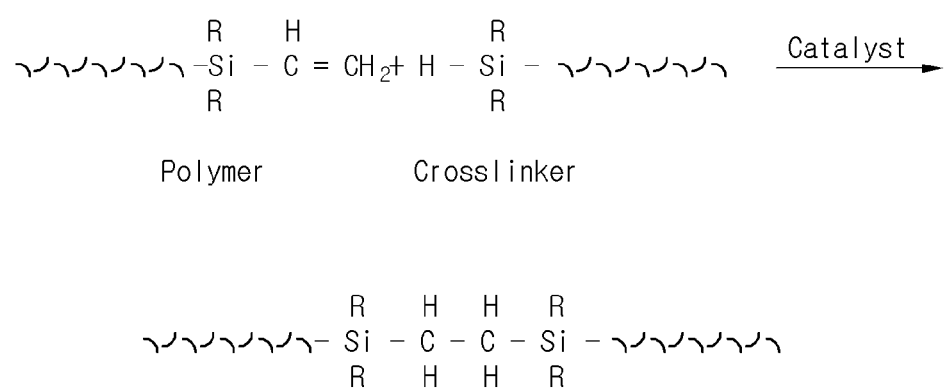

Meanwhile, FIGS. 11 and 12 are views to explain another example of the preparation of the benzotriazol reactant in the light emitting device package according to the embodiment. FIG. 11 is a view to explain the curing mechanism of silicon, and FIG. 12 is a view to explain the reaction between an uncured vinyl group, which remains after the silicon has been cured, and benzotriazole.

If the benzotriazole is reacted after the silicon has been cured in order to form the molding part 260, the uncured vinyl group reacts to the benzotriazole, so that the benzotriazol reactant exists in the molding part 260. The benzotriazole reactant captures acid penetrated from the outside to prevent the penetrated acid from exerting an influence on the metallic parts.

Therefore, according to the embodiment, the unreacted acid contained in the body 240 or the molding part 260 can be removed to prevent the metallic parts from being discolored in the light emitting device package as the light emitting device is driven for a long time.

According to the embodiment, a material, such as benzotriazole, capable of capturing acid may be contained in the body 240. In addition, the material, such as benzotriazole, capable of capturing acid may be contained in the molding part 260. Further, the benzotriazole may be contained in both of the body 240 and the molding part 260.

Therefore, the body 240 or the molding part 260 may contain a benzotriazole reactant. The benzotriazole reactant may be a material prepared through the reaction between an acid component and a benzotriazole component. For example, the benzotriazole reactant may be a material prepared through the reaction between terephthalic acid and a benzotriazole component. In addition, the benzotriazole reactant may be a material prepared through the reaction between an uncured vinyl group and a benzotriazole component.

Meanwhile, the light emitting device package according to the embodiment further includes a benzotriazole (BTA) layer coated on at least one of the first and second electrodes 211 and 213. The light emitting device package is realized as described above, so that the benzotriazole layer can prevent the first electrode 211 or the second electrode 213 from being discolored.

Figure 13:
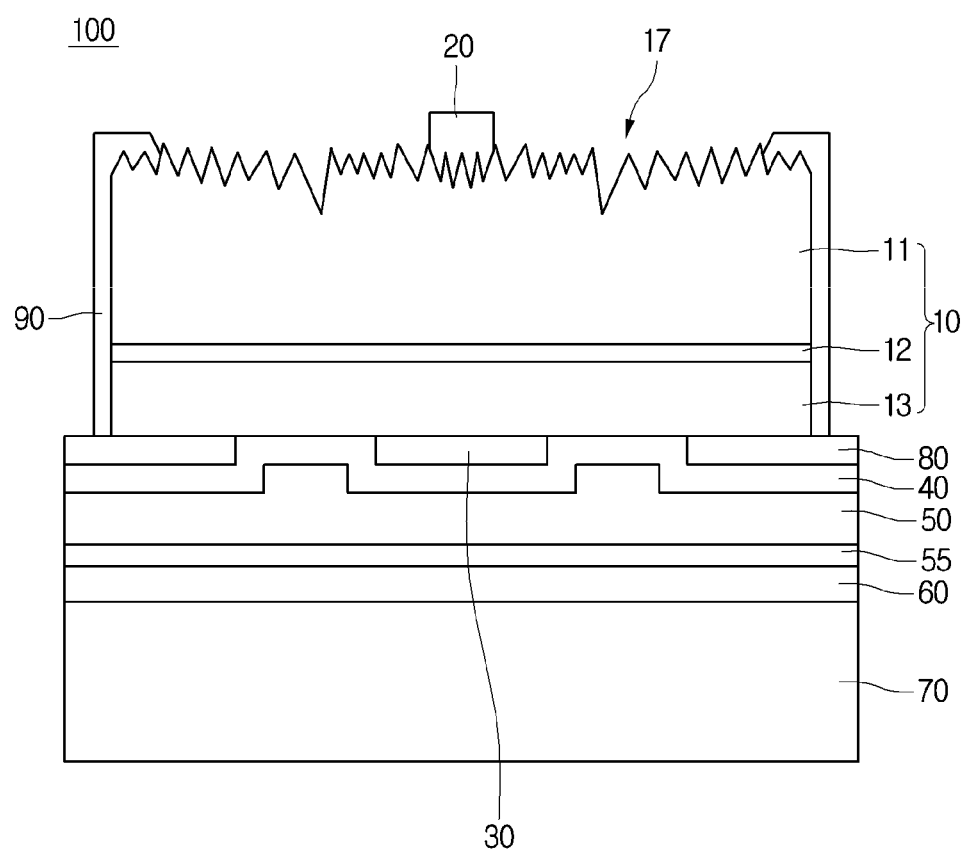
FIG. 13 is a sectional view to explain a light emitting device provided in the light emitting device package according to the embodiment.

Meanwhile, as one example, a light emitting device shown in FIG. 13 may be applied to the light emitting device package described with reference to FIG. 1. FIG. 13 is a sectional view showing the light emitting device according to the embodiment.

A light emitting device 100 according to the embodiment may include a light emitting structure 10, an electrode, and a reflective electrode 50 as shown in FIG. 13.

The light emitting structure 10 may include a first conductive semiconductor layer 11, an active layer 12, and a second conductive semiconductor layer 13. A concave-convex pattern 17 may be provided on a top surface of the first conductive semiconductor layer 11.

For example, the first conductive semiconductor layer 11 may include an N type semiconductor layer doped with N type dopants serving as first conductive dopants, and the second conductive semiconductor layer 13 may include a P type semiconductor layer doped with P type dopants serving as second conductive dopants. Alternatively, the first conductive semiconductor layer 11 may include a P type semiconductor layer, and the second conductive semiconductor layer 13 may include an N type semiconductor layer.

For example, the first conductive semiconductor layer 11 may include an N type semiconductor layer. The first conductive semiconductor layer 11 may be realized by using a semiconductor material having a composition formula of $In_xAl_yGa_{1-x-y}N$ ($0 \leq x \leq 1$, $0 \leq y \leq 1$, and $0 \leq x+y \leq 1$). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP, and may be doped with N type dopants such as Si, Ge, Sn, Se, or Te.

The active layer 12 is a layer to emit light due to the energy band gap difference according to materials constituting the active layer 12 as electrons (or holes) injected through the first conductive semiconductor layer 11 meet holes (or electrons) injected through the second conductive semiconductor layer 13. The active layer 12 may be formed in any one of a single quantum well structure, a multi-quantum well (MQW) structure, a quantum dot structure, and a quantum wire structure, but the embodiment is not limited thereto.

For example, the active layer 12 may be realized by using a semiconductor material having a composition formula of $In_xAl_yGa_{1-x-y}N$ ($0 \leq x \leq 1$, $0 \leq y \leq 1$, and $0 \leq x+y \leq 1$). If the active layer 12 is realized in the MQW structure, the active layer 12 may be realized by stacking a plurality of well layers and a plurality of barrier layers. For example, the active layer 12 may be realized at a cycle of InGaN well layer/GaN barrier layer.

For example, the second conductive semiconductor layer 13 may be realized by using a P type semiconductor layer. The second conductive semiconductor layer 13 may be realized by using a semiconductor material having a composition formula of $In_xAl_yGa_{1-x-y}N$ ($0 \leq x \leq 1$, $0 \leq y \leq 1$, and $0 \leq x+y \leq 1$). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP, and may be doped with a P type dopant such as Mg, Zn, Ca, Sr, or Ba.

Meanwhile, the first conductive semiconductor layer 11 may include a P type semiconductor layer and the second conductive semiconductor layer 13 may include the N type semiconductor layer. In addition, a semiconductor layer including an N type semiconductor layer or P type semiconductor layer may be additionally formed under the second conductive semiconductor layer 13. Accordingly, the light emitting structure 10 may have at least one of an NP junction structure, a PN junction structure, an NPN junction structure, and a PNP junction structure. In addition, impurities may be doped into the first conductive semiconductor layer 11 and the second conductive semiconductor layer 13 with uniform or non-uniform doping concentration. In other words, the light emitting structure 10 may have various structures, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

The concave-convex pattern 17 may be provided on the top surface of the first conductive semiconductor layer 11. If the first conductive semiconductor layer 11 is a GaN layer, the face in which the concave-convex pattern 17 is formed may be an N face when a growth direction and an etching direction are taken into consideration.

An ohmic contact layer 40 and the reflective electrode 50 may be provided under the light emitting structure 10. The electrode 20 may be provided on the light emitting structure 10. The electrode 20 and the reflective electrode 50 may supply power to the light emitting structure 10. The ohmic contact layer 40 may make ohmic-contact with the light emitting structure 10. In addition, the reflective electrode 50 may reflect light incident thereto from the light emitting structure 10 to increase the quantity of light extracted to the outside.

For example, the ohmic contact layer 40 may include a transparent conductive oxide layer. For example, the ohmic contact layer 40 may include at least one selected from the group consisting of indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, and NiO.

The reflective electrode 50 may include a metallic material having a high reflectance. For example, the reflective electrode 50 may include metal including at least one of Ag, Ni, Al, Rh, Pd, Ir, Ru, Mg, Zn, Pt, Cu, Au, Hf and the alloy thereof. In addition, the reflective electrode 50 may be formed in a multi-layer structure by using the metal or the alloy and a transmissive conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), or antimony-tin-oxide (ATO). For example, according to the embodiment, the reflective electrode 50 may include at least one of Ag, Al, an Ag—Pd—Cu alloy, and an Ag—Cu alloy.

A current blocking layer (CBL) 30 may be interposed between the light emitting structure 10 and the ohmic contact layer 40. The CBL 30 may be formed at a region having at least a portion overlapped with the electrode 20 in a vertical direction, which prevents current from being concentrated on the shortest distance between the electrode 20 and the reflective electrode 40 so that the light emission efficiency of the light emitting device according to the embodiment can be improved.

The CBL 30 may be formed by using a material having an electric insulating property or making schottky-contact with the light emitting structure 10. The CBL 30 may include an oxide, a nitride, or metal. For example, the CBL 30 may include at least one selected from the group consisting of $SiO_2$, $SiO_x$, $SiO_xN_y$, $Si_3N_4$, $Al_2O_3$, $TiO_x$, Ti, Al, and Cr.

The CBL 30 may be provided at a first region under the light emitting structure 10, and the ohmic contact layer 40 may be provided at a second region under the light emitting structure 10 and the CBL 30. The ohmic contact layer 40 may be interposed between the light emitting structure 10 and the reflective electrode 50. The ohmic contact layer 40 may be interposed between the CBL 30 and the reflective electrode 50.

An isolation layer 80 may be further interposed between the light emitting structure 10 and the ohmic contact layer 40. The isolation layer 80 may be provided at a lower peripheral portion of the light emitting structure 10 and on the ohmic contact layer 40. For example, the isolation layer 80 may include a material having an electric insulating property or a material having electric conductivity lower than that of the light emitting structure 10. For example, the isolation layer 80 may be realized by using an oxide or a nitride. For example, the isolation layer 80 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO. The isolation layer 80 may include a material the same as or different from a material constituting the CBL 30. The isolation layer 80 may be named "channel layer".

A diffusion barrier layer 55, a bonding layer 60, and a support member 70 may be provided under the reflective electrode 50.

The diffusion barrier layer 55 may prevent a material contained in the bonding layer 60 from being diffused toward the reflective electrode 50 in the process of providing the bonding layer 60. The diffusion barrier layer 55 may prevent a material such as tin (Sn) contained in the bonding layer 60 from exerting an influence on the reflective electrode 50. The diffusion barrier layer 55 may include at least one selected from the group consisting of Cu, Ni, Ti—W, W, and Pt.

The bonding layer 60 includes barrier metal or bonding metal. For example, the bonding layer 60 may include at least one selected from the group consisting of Ti, Au, Sn, Ni, Cr, Ga, In, Bi, Cu, Ag, and Ta. The support member 70 may support the light emitting device according to the embodiment, and may be electrically connected to an external electrode to supply power to the light emitting structure 10. For example, the support member 70 may include at least one selected from the group consisting of Ti, Cr, Ni, Al, Pt, Au, W, Cu, Mo, Cu—W and a semiconductor substrate (for example, including Si, Ge, GaN, GaAs, ZnO, SiC, or SiGe) doped with impurities. The support member 70 may include an insulating material.

A protective layer 90 may be further provided on the light emitting structure 10. The protective layer 90 may be realized by using an oxide or a nitride. For example, the protective layer 90 may include a material, such as SiO2, SiOx, SiOxNy, Si3N4, or Al2O3, having transmittance and an insulating property. The protective layer 90 may be provided on a lateral side of the light emitting structure 10. In addition, the protective layer 90 may be provided at an upper portion of the light emitting structure 10 as well as the lateral side of the light emitting structure 10.

The above description has been made regarding the light emitting device having the vertical-type structure in which the electrode 20 is arranged on the upper portion of the light emitting structure 10, and the reflective electrode 50 is arranged at a lower portion of the light emitting structure 10. However, according to the light emitting device of the present embodiment, the locations and the shapes of the first electrode electrically connected to the first conductive semiconductor layer 11 constituting the light emitting structure 10 and the second electrode electrically connected to the second conductive semiconductor layer 13 constituting the light emitting structure 10 may be variously modified. In addition, the light emitting device according to the present embodiment is applicable to a light emitting device having a lateral-type structure in which the first and second electrodes are exposed in the same direction.

Figure 14:
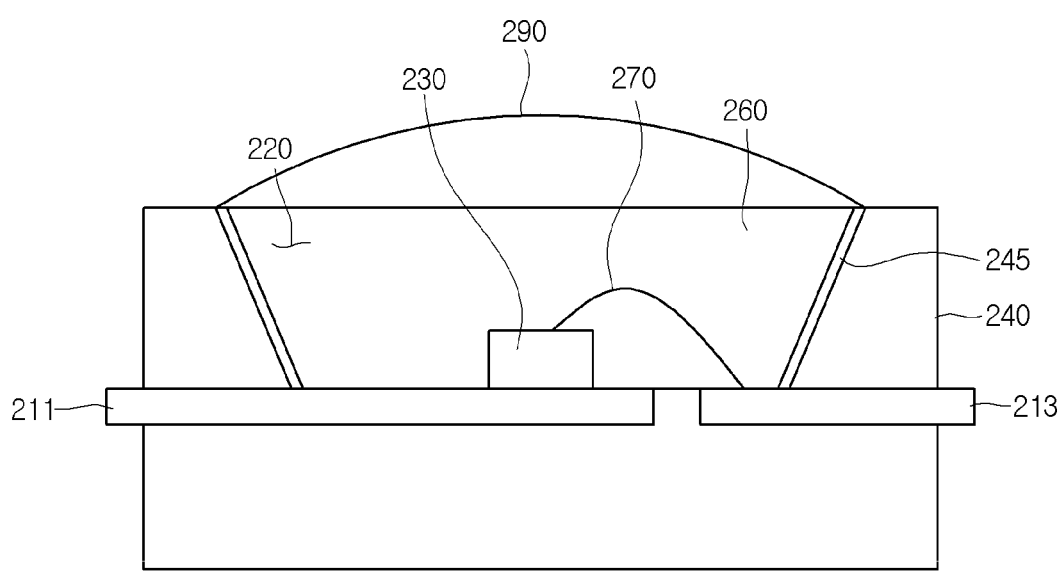
FIG. 14 is a sectional view to explain another example of a light emitting device package according to the embodiment.

FIG. 14 is a sectional view showing another example of a light emitting device package according to the embodiment. Referring to FIG. 14, in the following description of the light emitting device package according to the embodiment, the structure and the elements the same as the structure and the elements described with reference to FIG. 1 will not be further described.

As shown in FIG. 14, the light emitting device package according to the embodiment may further include a lens 290 on the body 240. The orientation angle of light emitted from the light emitting device package may be adjusted by the lens 290.

In addition, according to the embodiment, a reflective part 245 may be interposed between the molding part 260 and the body 240. For example, the reflective part 245 may be coated with a reflective material. The light emitted from the light emitting device 230 can be effectively extracted to the outside by the reflective part 245. The reflective part 245 may include an inorganic paste or an organic paste. For example, the reflective part 245 may include silver (Ag) paste.

Meanwhile, various materials may be applied when the body 240 and the molding part 260 are realized. As the light emitting device 230 is driven for a long time, metallic parts of the first electrode 211, the second electrode 213, and the reflective part 245 may be discolored. If the metallic parts are discolored, the luminous intensity of the light emitting device package may be degraded.

It is analyzed that the metallic parts are discolored because an acid material included in the body 240 or an acid material penetrated into the body 240 through the molding part 260 exerts an influence on the metallic parts. Accordingly, the present embodiment suggests a scheme of preventing the acid material contained in the body 240 or the molding part 260 from exerting an influence on the metallic parts to discolor the metallic parts.

For example, when the body 240 may be formed by using the PPA resin or the PCT resin, threphthalic acid may remain in the body 240 after polymerization.

In this case, the metallic parts may be discolored due to the side effect (metal corrosion by —COOH) of terephthalic acid remaining after the polymerization of the PPA resin or the PCT resin. It is analyzed that oxidation from —COOH ions to OH-ions occurs on a surface of the metallic part under a high temperature environment, so that the surface of the metallic part has an oxide layer thereon without being corroded. Accordingly, the metallic parts are discolored. In addition, according to the analysis, activated metal and hydroxide are formed due to the dissociation of —COOH ions to OH-ions under a high humidity environment. Accordingly, the metallic parts are discolored and the luminous intensify is degraded.

The embodiment suggests the scheme of capturing acid contained in the body 240 or the molding part 260. For example, benzotriazole (BTA) may be applied in order to capture the acid contained in the body 240 or the molding part 260.

When the benzotriazole is applied after forming the body 240, the benzotriazole may react to the terephthalic acid remaining after PPA resin or PCT resin polymerization.

In other words, as shown in FIG. 9, unreacted monomers may exist in a polymerization resultant of the PPA resin or the PCT resin. In FIG. 9, reference sign A represents a polymer reactant of the PPA resin or the PCT resin, and reference sign B represents an unreacted monomer. In this case, if benzotriazole is added to the polymerization resultant, the benzotriazole reacts to the unreacted monomer as shown in FIG. 10 so that the benzotriazole reactant C is prepared. For example, unreacted terephthalic acid reacts to the benzotriazole so that the unreacted terephthalic acid may be removed.

Meanwhile, FIGS. 11 and 12 are views to explain another example of the preparation of the benzotriazol reactant in the light emitting device package according to the embodiment. FIG. 11 is a view to explain the curing mechanism of silicon, and FIG. 12 is a view to explain the reaction between an uncured vinyl group, which remains after the silicon has been cured, and benzotriazole.

If the benzotriazole is reacted after the silicon has been cured in order to form the molding part 260, the uncured vinyl group reacts to the benzotriazole, so that the benzotriazol reactant exists in the molding part 260. The benzotriazole reactant captures acid penetrated from the outside to prevent the penetrated acid from exerting an influence on the metallic parts.

Therefore, according to the embodiment, the unreacted acid contained in the body 240 or the molding part 260 can be removed to prevent the metallic parts from being discolored in the light emitting device package as the light emitting device is driven for a long time.

According to the embodiment, a material, such as benzotriazole, capable of capturing acid may be contained in the body 240. In addition, the material such as benzotriazole, capable of capturing acid may be contained in the molding part 260. Further, the benzotriazole may be contained in both of the body 240 and the molding part 260.

Therefore, the body 240 or the molding part 260 may contain a benzotriazole reactant. The benzotriazole reactant may be a material prepared through the reaction between an acid component and a benzotriazole component. For example, the benzotriazole reactant may be a material prepared through the reaction between terephthalic acid and a benzotriazole component. In addition, the benzotriazole reactant may be a material prepared through the reaction between an uncured vinyl group and a benzotriazole component.

Meanwhile, the light emitting device package according to the embodiment further includes a benzotriazole (BTA) layer coated on at least one of the first and second electrodes 211 and 213. The light emitting device package is realized as described above, so that the benzotriazole layer can prevent the first electrode 211 or the second electrode 213 from being discolored.

The light emitting device package according to the embodiment is applicable to a light unit. The light unit may include a structure in which a plurality of light emitting devices are arrayed, and may include a display device shown in FIGS. 15 and 16, and a lighting device shown in FIG. 17.

Figure 15:
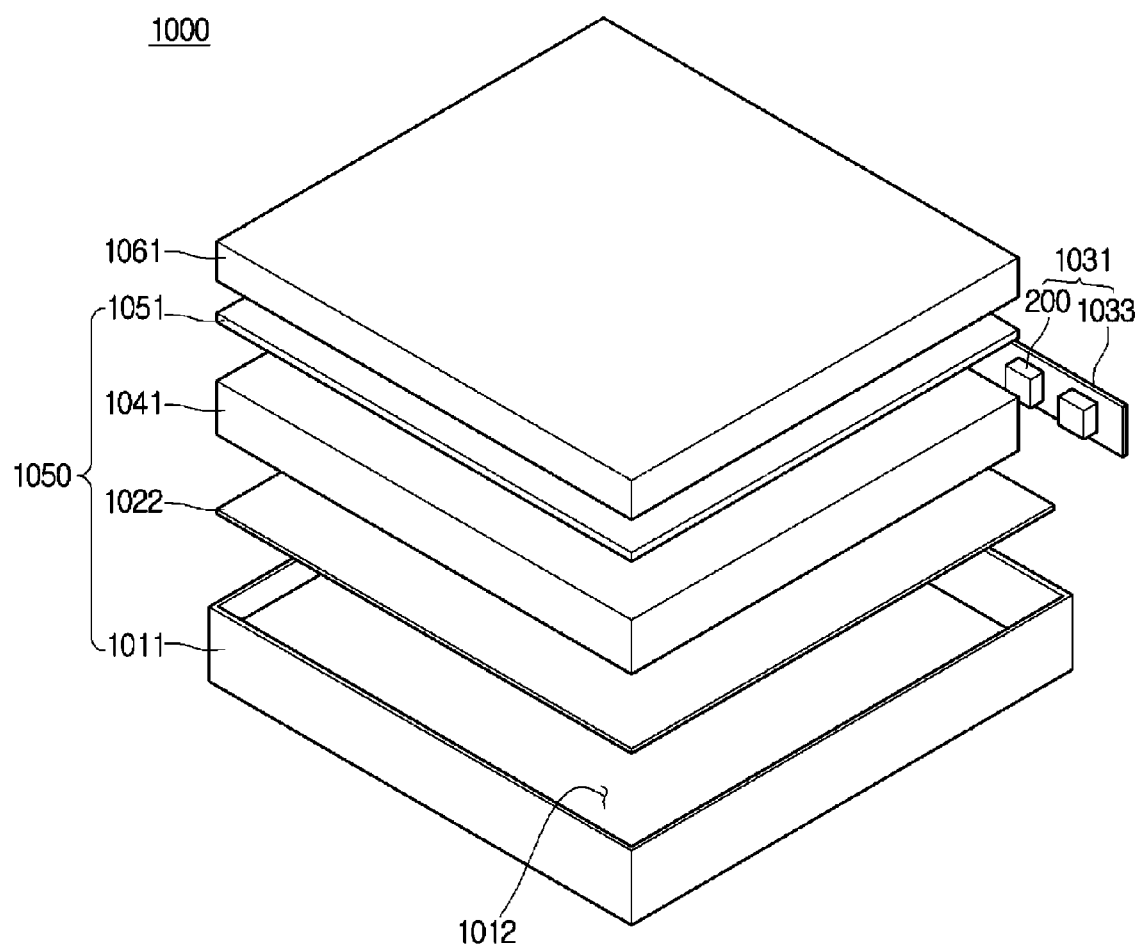
FIG. 15 is a perspective view showing a display device according to the embodiment.

Referring to FIG. 15, a display device 1000 according to the embodiment includes a light guide plate 1041, a light emitting module 1031 to supply the light to the light guide plate 1041, a reflective member 1022 provided under the light guide plate 1041, an optical sheet 1051 provided on the light guide plate 1041, a display panel 1061 provided on the optical sheet 1051, and a bottom cover 1011 to receive the light guide plate 1041, the light emitting module 1031, and the reflective member 1022, but the embodiment is not limited thereto. The light unit 1050 may include the bottom cover 1011, the reflective member 1022, the light guide plate 1041, and the optical sheet 1051.

The light guide plate 1041 diffuses the light to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cycloolefin copolymer) and PEN (polyethylene naphthalate) resin.

The light emitting module 1031 supplies light to at least one lateral side of the light guide plate 1041, and ultimately serves as the light source of the display device.

At least one light emitting module 1031 may be provided to directly or indirectly supply the light from one lateral side of the light guide plate 1041. The light emitting module 1031 may include a board 1033 and a light emitting device or a light emitting device packages 200 according to the embodiment that has been described above. Light emitting device packages 200 may be arrayed at a predetermined interval on the board 1033.

The board 1033 may include a printed circuit board (PCB) including a circuit pattern. In addition, the board 1033 may include a metal core PCB (MCPCB) or a flexible PCB (FPCB) as well as a typical PCB, but the embodiment is not limited thereto. If the light emitting device package 200 is installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are arranged in such a manner that a light exit surface to emit light is spaced apart from the light guide plate 1041 by a predetermined distance, but the embodiment is not limited thereto. The light emitting device package 200 may directly or indirectly supply the light to a light incident part, which is one lateral side of the light guide plate 1041, but the embodiment is not limited thereto.

The reflective member 1022 may be provided under the light guide plate 1041. The reflective member 1022 reflects the light, which has been incident onto the bottom surface of the light guide plate 1041, upward, thereby improving the brightness of the light unit 1050. For example, the reflective member 1022 may include a PET, PC or PVC resin, but the embodiment is not limited thereto. The reflective member 1022 may be the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with a top cover (not shown), but the embodiment is not limited thereto.

The bottom cover 1011 may include metallic material or resin material and may be manufactured through a press molding process or an extrusion molding process. In addition, the bottom cover 1011 may include metal or a non-metallic material having superior thermal conductivity, but the embodiment is not limited thereto.

The display panel 1061, for example, serves as an LCD panel including first and second substrates, which are opposite to each other and include a transparent material, and a liquid crystal layer interposed between the first and second substrates. A polarizing plate may be attached to at least one surface of the display panel 1061, but the embodiment is not limited thereto. The display panel 1061 displays information by light passing through the optical sheet 1051. The display device 1000 is applicable to various portable terminals, monitors of notebook computers, monitors of laptop computers, and televisions.

The optical sheet 1051 is interposed between the display panel 1061 and the light guide plate 1041 and includes at least one transmissive sheet. For example, the optical sheet 1051 may include at least one among a diffusion sheet, a horizontal and vertical prism sheet, and a brightness enhanced sheet. The diffusion sheet diffuses the incident light, the horizontal and/or vertical prism sheet concentrates the incident light onto a display region, and the brightness enhanced sheet improves the brightness by reusing the lost light. In addition, a protective sheet may be provided on the display panel 1061, but the embodiment is not limited thereto.

The light guide plate 1041 and the optical sheet 1051 may be provided on the light path of the light emitting module 1031 as optical members, but the embodiment is not limited thereto.

Figure 16:
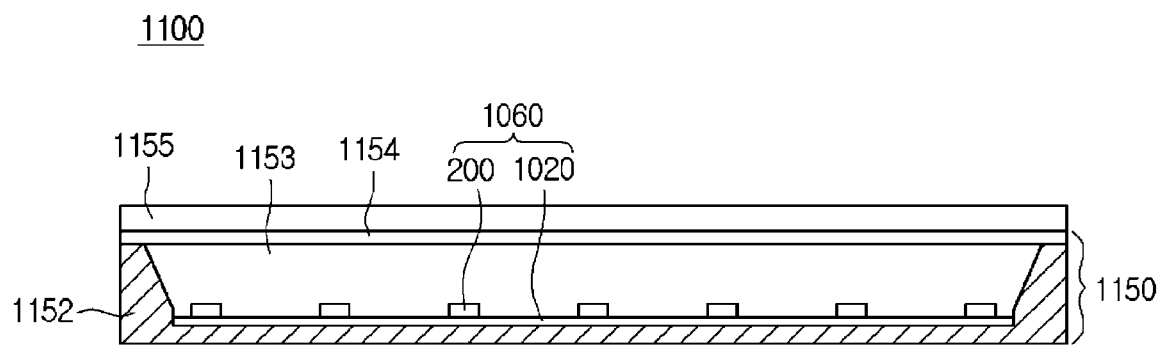
FIG. 16 is a sectional view showing another example of the display device according to the embodiment.

FIG. 16 is a sectional view showing another example of a display device according to the embodiment.

Referring to FIG. 16, a display device 1100 includes a bottom cover 1152, a board 1020 on which the above-disclosed light emitting devices 100 are arrayed, an optical member 1154, and a display panel 1155. The board 1020 and the light emitting device packages 200 may constitute a light emitting module 1060. The bottom cover 1152 may include a receiving part 1153, but the embodiment is not limited thereto.

The optical member 1154 may include at least one among a lens, a light guide plate, a diffusion sheet, a horizontal and vertical prism sheet, and a brightness enhanced sheet. The light guide plate may include a PC material or a PMMA (Poly methyl methacrylate) material. The light guide plate may be omitted.

The diffusion sheet diffuses the incident light, the horizontal and vertical prism sheet concentrates the incident light onto a display region, and the brightness enhanced sheet improves the brightness by reusing the lost light.

The optical member 1154 is provided on the light emitting module 1060 to emit light from the light emitting module 1060 to provide surface light, and diffuse and concentrate the light.

Figure 17:
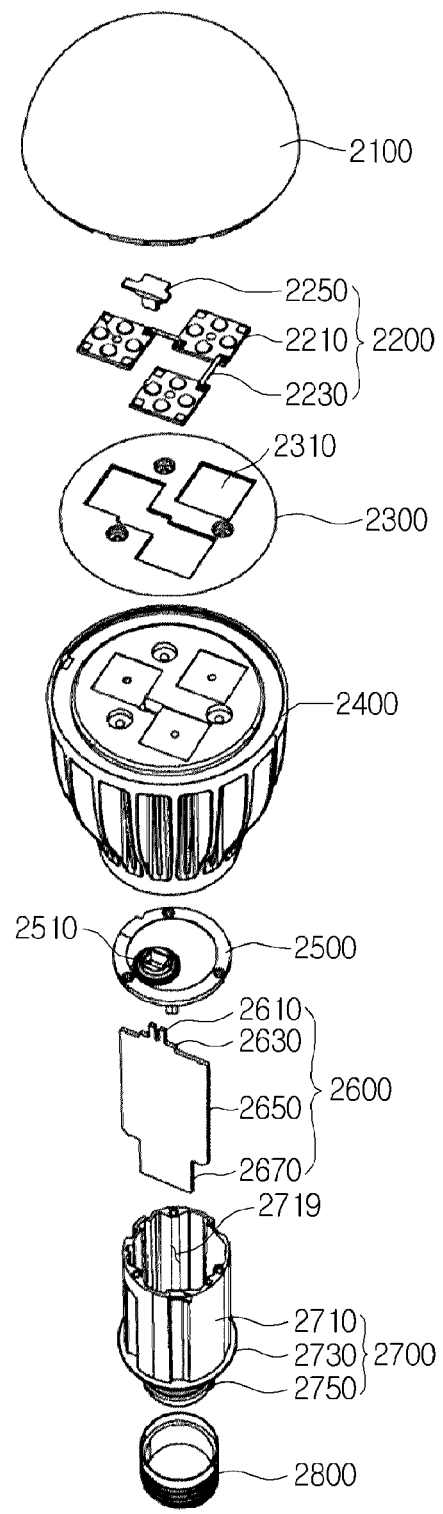
FIG. 17 is an exploded perspective view showing a lighting device according to the embodiment.

FIG. 17 is an exploded perspective view showing a lighting device according to the embodiment.

As shown in FIG. 17, the lighting device according to the embodiment may include a cover 2100, a light source module 2200, a heat radiator 2400, a power supply part 2600, an inner case 2700, and a socket 2800. The lighting device according to the embodiment may further include at least one of a member 2300 and a holder 2500. The light source module 2200 may include the light emitting device package according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module 2200. The cover 2100 may be a kind of optical member. The cover 2100 may be coupled with the heat radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface having surface roughness greater than that of the outer surface thereof. The surface roughness is provided for the purpose of sufficiently scattering and diffusing the light from the light source module 2200.

A material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be provided at one surface of the heat radiator 2400. Accordingly, the heat from the light source module 2200 is conducted to the heat radiator 2400. The light source module 2200 may include a light source part 2210, a connection plate 2230, and a connector 2250.

The member 2300 is disposed at a top surface of the heat radiator 2400, and has guide grooves 2310 into which a plurality of light sources 2210 and the connector 2250 are inserted. The guide grooves 2310 correspond to a board of the light source 2210 and the connector 2250.

A surface of the member 2300 may be coated with a light reflective material. For example, the surface of the member 2300 may be coated with white paint. The member 2300 again reflects light, which is reflected from the inner surface of the cover 2100 to return to the light source module 2200, toward the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the heat radiator 2400 may be electrically connected to the connection plate 2230. The member 2300 may include an insulating material, thereby preventing the connection plate 2230 from being electrically shorted with the heat radiator 2400. The heat radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through which a protrusion 2610 of the power supply part 2600 passes.

The power supply part 2600 processes or converts an electric signal received from the outside and provides the processed or converted electric signal to the light source module 2200. The power supply part 2600 is received in the receiving groove 2719 of the inner case 2700, and is closed inside the inner case 2700 by the holder 2500. The power supply part 2600 may include a protrusion 2610, a guide part 2630, a base 2650, and an extension part 2670.

The guide part 2630 has a shape protruding outward from one side of the base 2650. The guide part 2630 may be inserted into the holder 2500. A plurality of parts may be arranged above one surface of the base 2650. For example, the parts may include a DC converter to convert AC power supplied from an external power supply into DC power, a driving chip to control the driving of the light source module 2200, and an electrostatic discharge (ESD) protection device to protect the light source module 2200, but the embodiment is not limited thereto.

The extension part 2670 has a shape protruding outward from an opposite side of the base 2650. The extension part 2670 is inserted into the connection part 2750 of the inner case 2700, and receives an external electric signal. For example, the extension part 2670 may have a width narrower than or equal to that of the connection part 2750 of the inner case 2700. One terminal of a '+' electric wire and one terminal of a '−' electric wire are electrically connected to the extension part 2670 and opposite terminals of the '+' electric wire and the '−' electric wire may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body comprising a recess;
a first electrode and a second electrode disposed on a portion of the body;
a light emitting device disposed on the first electrode; and
a molding part disposed on the light emitting device,
wherein both the body and the molding part comprise a benzotriazol reactant,
wherein the body comprises an inclined side surface on the recess,
wherein the molding part contacts the inclined side surface of the body,
wherein the benzotriazol reactant is disposed between the inclined side surface of the body and the molding part,
wherein the benzotriazol reactant is disposed on the first electrode and the second electrode,
wherein the benzotriazol reactant is not disposed on the light emitting device,
wherein the benzotriazol reactant is not disposed on side surfaces of the light emitting device,
wherein the benzotriazol reactant is disposed under the first electrode and the second electrode,
wherein a portion of the first electrode and a portion of the second electrode protrude outwardly from sides of the body, and
wherein the portions of the first electrode and the second electrode protruding outwardly of the body do not contact side surfaces of the body.

2. The light emitting device package of claim 1, wherein the benzotriazol reactant is prepared through reaction between an acid component from the body or the molding part and a benzotriazol component, and
wherein the benzotriazol reactant contacts a bottom surface of the first electrode and a bottom surface of the second electrode.

3. The light emitting device package of claim 1, wherein the benzotriazol reactant is prepared through reaction between a terephthalic acid and a benzotriazol component.

4. The light emitting device package of claim 1, wherein the benzotriazol reactant is prepared through reaction between a benzotriazol component and an uncured vinyl group.

5. The light emitting device package of claim 1, wherein the body comprises at least one selected from the group consisting of a polyphthalamide resin, a PCT resin, and a silicone resin.

6. The light emitting device package of claim 1, wherein the molding part comprises at least one of a silicone resin and an epoxy resin.

7. The light emitting device package of claim 1, further comprising a reflective part disposed between the molding part and the body.

8. The light emitting device package of claim 1, wherein the molding part comprises a phosphor.

9. The light emitting device package of claim 1, wherein the first electrode or the second electrode comprises at least one selected from the group consisting of titanium, copper, nickel, gold, chromium, zinc, tantalum, platinum, tin, silver, phosphorus, aluminum, indium, palladium, cobalt, silicon, germanium, hafnium, ruthenium, iron, and an alloy thereof.

10. The light emitting device package of claim 1, wherein the molding part is disposed on both the light emitting device and top surfaces of the first and second electrodes.

11. The light emitting device package of claim 10, wherein the body is disposed on the first electrode and the second electrode.

12. The light emitting device package of claim 1, wherein the body comprises an exposed portion between the first electrode and the second electrode in the recess.

13. The light emitting device package of claim 12, wherein the benzotriazol reactant is disposed on the exposed portion of the body.

14. The light emitting device package of claim 1, wherein the benzotriazol reactant exists in the molding part.

15. The light emitting device package of claim 1, wherein the benzotriazol reactant is disposed on the inclined side surface.

16. The light emitting device package of claim 12, wherein the exposed portion of the body directly contacts the molding part.

17. The light emitting device package of claim 1, wherein a top surface of the body is flush with a top surface of the molding part.

18. The light emitting device package of claim 17, wherein a top most surface of the body is flush with the top surface of the molding part.

19. The light emitting device package of claim 1, wherein the first electrode comprises a penetrating portion which penetrates the body, and
   wherein the benzotriazol reactant is disposed between the penetrating portion and the body.

20. The light emitting device package of claim 1, wherein the benzotriazol reactant is disposed on a top surface of the molding part.

* * * * *